United States Patent
Watkins

(10) Patent No.: US 8,094,705 B2
(45) Date of Patent: Jan. 10, 2012

(54) FAST SERDES I/O CHARACTERIZATION

(75) Inventor: Daniel Watkins, Saratoga, CA (US)

(73) Assignee: Oracle America, Inc., Redwood City, CA (US)

(*) Notice: Subject to any disclaimer, the term of this patent is extended or adjusted under 35 U.S.C. 154(b) by 492 days.

(21) Appl. No.: 12/403,330

(22) Filed: Mar. 12, 2009

(65) Prior Publication Data
US 2010/0232489 A1    Sep. 16, 2010

(51) Int. Cl.
*H04B 3/46* (2006.01)
(52) U.S. Cl. .................. 375/224; 375/220; 375/213
(58) Field of Classification Search .................. 375/220, 375/224, 356, 358, 213
See application file for complete search history.

(56) References Cited

U.S. PATENT DOCUMENTS
2007/0291784 A1* 12/2007 Chan et al. .................. 370/463
2011/0103440 A1*  5/2011 Huff .............................. 375/220

OTHER PUBLICATIONS

Teradyne—Semiconductor Test—J750 Test System—News, Teradyne Showcases J750Ex and UltraFLEX at SEMICON China, Mar. 19, 2007, retrieved from http://www.teradyne.com/std/press/j750/2007-03-19.html, 1 page.

* cited by examiner

*Primary Examiner* — Emmanuel Bayard
(74) *Attorney, Agent, or Firm* — Osha • Liang LLP

(57) ABSTRACT

A system and method to perform automatic testing of a device using Design-for-Test functionality built-in a pair of serializer/deserializer (SERDES) of the device to perform I/O characterization with respect to clock jitter in a self-test mode. Performance of a SERDES operating with jitter injected clock signal is characterized by forming a self-test loop-back configuration with another SERDES operating with a clean clock signal where the clean clock signal and the jitter injected clock signal are supplied by a simplified tester.

20 Claims, 5 Drawing Sheets

FAST SERDES I/O CHARACTERIZATION

BACKGROUND

A Serializer/Deserializer (SERDES) is a pair of circuit blocks commonly used in high speed data communications. SERDES converts data between serial format and parallel format in transmit (TX) direction and receive (RX) direction. The basic SERDES function typically includes a Parallel-to-Serial converter for TX direction and a Serial-to-Parallel converter for RX direction. Based on the use of a SERDES, high speed data may be communicated via a pair of unidirectional point-to-point serial links commonly referred to as a lane.

The Parallel-to-Serial converter typically has a parallel clock input and a set of parallel data inputs. A Phase-Locked Loop (PLL) may be used to multiply the incoming parallel clock up to the higher serial clock rate. Alternatively, the serial clock may be externally supplied. Throughout this document, the term "clock" and "clock signal" may be used interchangeably depending on the context. One example of the Parallel-to-Serial converter may have a single shift register that receives the parallel data once per parallel clock cycle and shifts the serial data out at the higher serial clock rate. Other examples may use a double-buffer configuration.

The Serial-to-Parallel converter typically has a parallel clock output and a set of parallel data outputs. A high speed clock may be recovered using serial clock recovery technique. The Serial-to-Parallel converter then divides the recovered clock down to the parallel clock rate. Alternatively, the serial clock and parallel clock may be externally supplied. One example of the Serial-to-Parallel converter may have a double-buffer configuration of registers. One register is used to shift in the serial data stream at the higher serial clock rate, and the other register is used to hold valid parallel data outputs at the slower parallel clock rate.

Generally speaking, tests are applied in the manufacturing process for electronic circuits (e.g., a circuit including SERDES blocks). In some scenarios, tests may also be used for field maintenance in the customer environment. The tests are generally performed using an Automatic Test Equipment (ATE) or, for example in the case of field maintenance, using built-in self-test (BIST) functionality within the circuit itself. A load board, sometime referred to as interface board or DUT (device under test) board, is a circuit board designed to serve as an interface circuit between the ATE instruments and the device under test (DUT).

Design for Test (DFT) is a design technique that adds testability features to an electronic circuit design. DFT may use a test pattern generator, such as a pseudorandom number generator (PRNG), to generate input test patterns for testing purposes. An example PRNG uses a linear feedback shift register (LFSR), which is a shift register with an input as a linear function of a previous state of the shift register. For example, an input bit of the LFSR may be driven by the exclusive-or (XOR) function based on some parallel output bits of the LFSR.

Jitter is an unwanted variation of certain characteristics of a periodic signal in electronic circuits. Jitter may be present in characteristics such as amplitude, frequency, periodic rate, or phase of successive signal cycles. Jitter is sometimes referred to as timing jitter in clock recovery applications.

SUMMARY

In general, in one aspect, the invention relates to a tester for characterizing a device under test (DUT) comprising first and second serializer/deserializer (SERDES) modules. The system includes a first conductor adapted to, when the DUT is operatively coupled to the tester, couple a transmit (TX) output of the first SERDES module to a receive (RX) input of the second SERDES module, a first clock generator configured to, when the DUT is operatively coupled to the tester, clock the first SERDES module using a first clock signal, a second clock generator configured to, when the DUT is operatively coupled to the tester, clock the second SERDES module using a second clock signal, wherein the first clock signal is equivalent to the second clock signal with a first jitter, and a functional module configured to, when the DUT is operatively coupled to the tester, receive a first test result from the DUT by configuring the DUT to: convert, using the first SERDES module based on the first clock, first parallel test data generated by a first test pattern generator comprised in the DUT into first serial test data at the TX output of the first SERDES module, wherein the first serial test data is communicated to the RX input of the second SERDES module via the first conductor; convert, using the second SERDES module based on the second clock, the first serial test data at the RX input of the second SERDES module into first parallel verification data; and generate the first test result by analyzing the first parallel verification data based on a first pre-determined criterion using a first test pattern verifier comprised in the DUT.

In general, in one aspect, the invention relates to a method for characterizing a device under test (DUT) comprising first and second serializer/deserializer (SERDES) modules. The method includes coupling a transmit (TX) output of the first SERDES module to a receive (RX) input of the second SERDES module, clocking the first SERDES module using a first clock signal, clocking the second SERDES module using a second clock signal, wherein the first clock signal is equivalent to the second clock signal with a first jitter, and receiving a first test result from the DUT by configuring the DUT to convert, using the first SERDES module based on the first clock, first parallel test data generated by a first test pattern generator comprised in the DUT into first serial test data at the TX output of the first SERDES module, wherein the first serial test data is communicated to the RX input of the second SERDES module via the first conductor, convert, using the second SERDES module based on the second clock, the first serial test data at the RX input of the second SERDES module into first parallel verification data, and generate the first test result by analyzing the first parallel verification data based on a first pre-determined criterion using a first test pattern verifier comprised in the DUT.

In general, in one aspect, the invention relates to a computer readable medium having instructions for characterizing a device under test (DUT) comprising first and second serializer/deserializer (SERDES) modules. The instructions when executed by a processor comprising functionality for coupling a transmit (TX) output of the first SERDES module to a receive (RX) input of the second SERDES module, clocking the first SERDES module using a first clock signal, clocking the second SERDES module using a second clock signal, wherein the first clock signal is equivalent to the second clock signal with a first jitter, and receiving a first test result from the DUT by configuring the DUT to convert, using the first SERDES module based on the first clock, first parallel test data generated by a first test pattern generator comprised in the DUT into first serial test data at the TX output of the first SERDES module, wherein the first serial test data is communicated to the RX input of the second SERDES module via the first conductor, convert, using the second SERDES module based on the second clock, the first serial test data at the RX input of the second SERDES module into first parallel verification data, and generate the first test result by analyzing the first parallel verification data based on a first pre-determined criterion using a first test pattern verifier comprised in the DUT.

Other aspects of the invention will be apparent from the following description and the appended claims.

DETAILED DESCRIPTION

Figure 1:
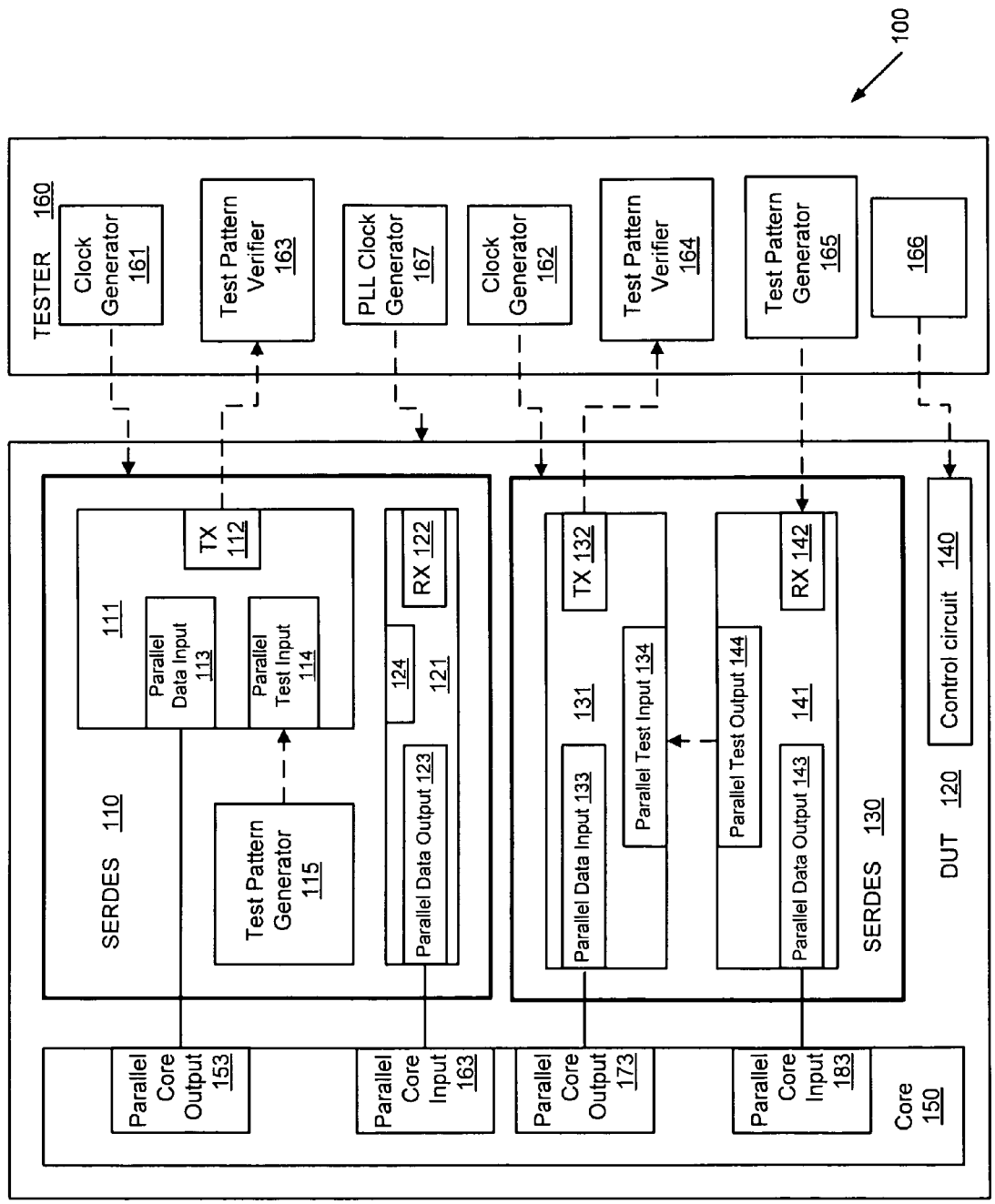
FIGS. 1 and 2 show schematic block diagrams of example systems in accordance with one or more embodiments of the invention.

Specific embodiments of the invention will now be described in detail with reference to the accompanying Figures. Like elements in the various Figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a system and method to perform automatic manufacturing or field testing of electronic circuit using DFT functionality built-in the electronic circuit. More specifically, embodiments of the invention employ DFT functionality built-in a pair of SERDES to perform I/O characterization with respect to clock jitter in a self-test mode. In one or more embodiments of the invention, performance of a SERDES operating with jitter injected clock signal may be characterized by forming a self-test loop-back configuration with another SERDES operating with a clean clock signal where the clean clock signal and the jitter injected clock signal are supplied by a simplified tester. In one or more embodiments of the invention, Parallel-to-Serial converter and Serial-to-Parallel converter in the SERDES cannot be independently clocked from an external source such as the simplified tester.

FIG. 1 shows a schematic block diagram of a system (100) in accordance with one or more embodiments of the invention. In one or more embodiments of the invention, one or more of the modules shown in FIG. 1 may be omitted, repeated, and/or substituted. Accordingly, those skilled in the art will appreciate many variations to the specific arrangements of modules shown in FIG. 1, which are also embodiments of the invention.

As shown in FIG. 1, DUT (120) is operatively coupled to tester (160) where dashed lines represent couplings from inputs and outputs of DUT (120) to tester (160). For example, DUT (120) may be mounted on a load board (not shown) of the tester (160) and attached to a test head (e.g., via a socket or surface mount fixture) of the load board such that inputs and outputs of DUT (120) may be controlled and verified by tester (160). Further as shown in FIG. 1, DUT (120) includes I/O modules (e.g., SERDES (110), SERDES (130)), functional block (e.g., core (150), and other control circuits (e.g., control circuit (140)).

As shown in FIG. 1, SERDES (110) includes Parallel-to-Serial converter (111) and Serial-to-Parallel converter (121) to provide one lane of external serial data link, which includes signal nodes TX (112) and RX (122). Parallel-to-Serial converter (111) may be configured to convert parallel data received at parallel data input (113) from parallel core output (153) of core (150) to serial data presented to TX (112). Serial-to-Parallel converter (121) may be configured to convert serial data received at RX (122) to parallel data presented to parallel data output (123) to be received by core (150) at parallel core input (163).

As shown in FIG. 1, SERDES (130) includes Parallel-to-Serial converter (131) and Serial-to-Parallel converter (141) to provide one lane of external serial data link, which includes signal nodes TX (132) and RX (142). Parallel-to-Serial converter (131) may be configured to convert parallel data received at parallel data input (133) from parallel core output (173) of core (150) to serial data presented to TX (132). Serial-to-Parallel converter (141) may be configured to convert serial data received at RX (142) to parallel data presented to parallel data output (143) to be received by core (150) at parallel core input (183).

In one or more embodiments of the invention, parallel data paths supported by SERDES (110) and SERDES (130) may be of same width or of different widths. In one or more embodiments of the invention, SERDES (110) and SERDES (130) may receive input clock signals (not shown) in serial or parallel rate format. In one or more embodiments of the invention, SERDES (110) and SERDES (130) may receive input clock signals from within DUT (120) or external to DUT (120). In one or more embodiments of the invention, when DUT (120) (in particular, SERDES (110) or SERDES (130)) enters a self-test mode, sources supplying input clock signals to SERDES (110) and SERDES (130) may be disabled and substituted by clock generators in tester (160).

Further as shown in FIG. 1, control circuit (140) may be configured to receive commands from tester (160) for causing SERDES (110) and SERDES (130) to enter self-test mode in which parallel data inputs (113) and (133) of Parallel-to-Serial converters (111) and (131) are substituted (e.g., via a multiplexer (not shown) controlled by control circuit (140) described below) by parallel test inputs (114) and (134), respectively while parallel data generated by Serial-to-Parallel converters (121) and (141) are diverted (e.g., via a multiplexer (not shown) controlled by control circuit (140)) from parallel data outputs (123) and (143) to parallel test outputs (124) and (144), respectively. In addition, SERDES (110) includes test pattern generator (115) for supplying parallel test data to parallel test input (114) in the self-test mode.

In one or more embodiments of the invention, test pattern generator (115) or a modified version may be repeated in other I/O modules (e.g., SERDES 130)) configured with DFT functionality. In one or more embodiments of the invention, test pattern generator (115) may be shared by other I/O modules having a common data path width. In one or more embodiments of the invention, test pattern generator (115) may be centralized in DUT (120) and not be included in any particular I/O module. In one or more embodiments of the invention, test pattern generator (115) may be implemented using a pseudorandom number generator (PRNG) such as a linear feedback shift register (LFSR). In such embodiment, parameters of the PRNG and/or LFSR may be configured by or in communication with tester (160) (e.g., via control circuit (140)) such that pertinent information (e.g., a reference test pattern) of generated parallel test data is available to tester (160) for performing the test verification.

Further as shown in FIG. 1, tester (160) includes clock generator (161) configured to clock SERDES (110) after DUT (120) enters the self-test mode such that serial verification data may be received at TX (112) for verification by test pattern verifier (163). Here, the serial verification data is converted in the self-test mode, by Parallel-to-Serial converter (111) from parallel test data generated by test pattern generator (115). In one or more embodiments of the invention, test pattern verifier (163) may be configured to generate test results such as a measure of bit error rate (BER) of SERDES (110) by comparing the serial verification data to a reference test pattern. Techniques known to those skilled in the art may be employed for generating and verifying such test patterns.

Further as shown in FIG. 1, tester (160) includes clock generator (162), test pattern generator (165), and test pattern verifier (164). Clock generator (162) may be configured to clock SERDES (130) after DUT (120) enters the self-test mode such that serial test data generated by test pattern generator (165) may be received at RX (142), converted into parallel test data by Serial-to-Parallel converter (141), and presented to parallel test output (144). Parallel-to-Serial converter (131) may be configured to convert, in the self-test mode, parallel test data at parallel test output (144) into serial verification data presented to TX (132) for verification by test pattern verifier (164). In one or more embodiments of the invention, test pattern verifier (164) may be configured to generate test results such as a measure of bit error rate (BER) of SERDES (130) by comparing the serial verification data with a delayed version of the serial test data generated by the test pattern generator (165). Techniques known to those skilled in the art may be employed for generating and verifying such test patterns to generate the test results.

Further as shown in FIG. 1, tester (160) includes controller (166) and Phase-Locked-Loop (PLL) clock generator (167). Controller (166) may be configured to cause DUT (120) to enter or exit the self-test mode. PLL clock generator (167) may be configured to supply a high frequency clock to DUT (120). In one or more embodiments of the invention, DUT (120) may be configured to use the high frequency clock as a master clock for core (150) and use the clock signals received from clock generators (161) and (162) as I/O clocks in serial or parallel clock rate. In one or more embodiments of the invention, clock generators (161), (162), and (167) may be configured to introduce (i.e., inject) a jitter into the high frequency clock or the I/O clocks to characterize the performance (e.g., BER) of DUT (120) corresponding to the introduced jitter. Techniques known to those skilled in the art may be employed for generating/configuring various clock formats and injecting jitters.

Although not explicitly shown in FIG. 1, various components of tester (160) may be configured to communicate and/or coordinate among each other to perform the various functionalities described above. For example, parameters and test patterns of various clock generators, test pattern generator, and test pattern verifiers may be stored, processed, and programmed by a processor (with associated memory and other data repository) of a computer system (not shown) embedded in tester (160). Furthermore, tester pin electronics, socket or surface mount adapter components, series or parallel termination components, unidirectional or bidirectional buffer components, etc. that may be associated with one or more of the signal paths represented by dashed lines between DUT (120) and tester (160) are omitted in FIG. 1 for clarity.

Figure 2:
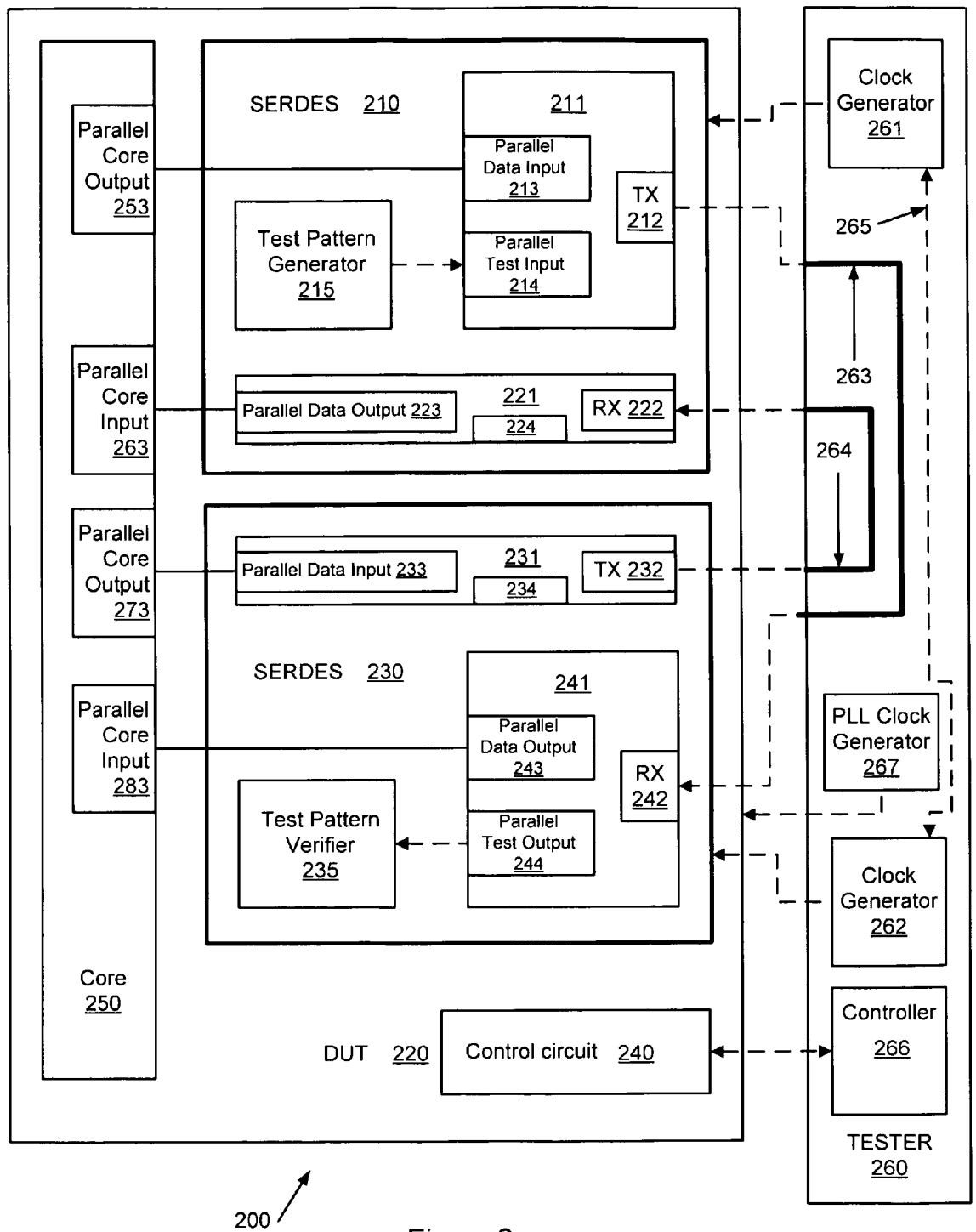

FIG. 2 shows a schematic block diagram of a system (200) in accordance with one or more embodiments of the invention. In one or more embodiments of the invention, one or more of the modules shown in FIG. 2 may be omitted, repeated, and/or substituted. Accordingly, those skilled in the art will appreciate many variations to the specific arrangements of modules shown in FIG. 2, which are also embodiments of the invention.

As shown in FIG. 2, DUT (220) is operatively coupled to tester (260) where dashed lines represent couplings from inputs and outputs of DUT (220) to tester (260). For example, DUT (220) may be mounted on a load board (not shown) of the tester (260) and attached to a test head (e.g., via a socket or surface mount fixture) of the load board such that inputs and outputs of DUT (220) may be controlled and verified by tester (260). Further as shown in FIG. 2, DUT (220) includes I/O modules (e.g., SERDES (210), SERDES (230)), functional block (e.g., core (250)), and other control circuits (e.g., (240)).

As shown in FIG. 2, SERDES (210) includes Parallel-to-Serial converter (211) and Serial-to-Parallel converter (221) to provide one lane of external serial data link, which includes signal nodes TX (212) and RX (222). Parallel-to-Serial converter (211) may be configured to convert parallel data received at parallel data input (213) from parallel core output (253) of core (250) to serial data presented to TX (212). Serial-to-Parallel converter (221) may be configured to convert serial data received at RX (222) to parallel data presented to parallel data output (223) to be received by core (250) at parallel core input (263).

As shown in FIG. 2, SERDES (230) includes Parallel-to-Serial converter (231) and Serial-to-Parallel converter (241) to provide one lane of external serial data link, which includes signal nodes TX (232) and RX (242). Parallel-to-Serial converter (231) may be configured to convert parallel data received at parallel data input (233) from parallel core output (273) of core (250) to serial data presented to TX (232). Serial-to-Parallel converter (241) may be configured to convert serial data received at RX (242) to parallel data presented to parallel data output (243) to be received by core (250) at parallel core input (283).

In one or more embodiments of the invention, parallel data paths supported by SERDES (210) and SERDES (230) may be of same width or of different widths. In one or more embodiments of the invention, SERDES (210) and SERDES (230) may receive input clock signals (not shown) in serial or parallel rate format. In one or more embodiments of the invention, SERDES (210) and SERDES (230) may receive input clock signals from within DUT (220) or external to DUT (220). In one or more embodiments of the invention, when DUT (220) (in particular, SERDES (210) and SERDES (230)) enters a self-test mode, sources supplying input clock signals to SERDES (210) and SERDES (230) may be disabled and substituted by clock generators in tester (260). In one or more embodiments of the invention, on, when DUT (220) (in particular, SERDES (210) and SERDES (230)) enters the self-test mode, required clock signals for operation of Parallel-to-Serial converter and Serial-to-Parallel converter in each SERDES (e.g., (210) or (230)) can not be independently controlled externally.

For example, external clock inputs to Parallel-to-Serial converter and Serial-to-Parallel converter in one SERDES (e.g., (210) or (230)) may be synchronized based on internal circuits when DUT (220) (in particular, the SERDES (210) or (230)) enters the self-test mode.

Further as shown in FIG. 2, control circuit (240) may be configured to receive commands from tester (260) for causing SERDES (210) and SERDES (230) to enter self-test mode in which parallel data inputs (213) and (233) of Parallel-to-Serial converters (211) and (231) are substituted (e.g., via a multiplexer (not shown) controlled by control circuit (240)) by parallel test inputs (214) and (234), respectively while parallel data generated by Serial-to-Parallel converters (221) and (241) are diverted (e.g., via a multiplexer (not shown) controlled by control circuit (240)) from parallel data outputs (223) and (243) to parallel test outputs (224) and (244), respectively.

In addition, SERDES (210) includes test pattern generator (215) for supplying parallel test data to parallel test input (214) in the self-test mode. In one or more embodiments of the invention, test pattern generator (215) or a modified version may be repeated in other I/O modules (e.g., SERDES (230)) configured with DFT functionality. In one or more embodiments of the invention, test pattern generator (215) may be shared by other I/O modules having a common data path width. In one or more embodiments of the invention, test pattern generator (215) may be centralized in DUT (220) and not included in any particular I/O module. In one or more embodiments of the invention, test pattern generator (215) may be implemented using a pseudorandom number generator (PRNG) such as a linear feedback shift register (LFSR). In such embodiment, parameters of the PRNG and/or LFSR may be configured by or in communication with tester (260) (e.g., via control circuit (240)) such that pertinent information (e.g., a reference test pattern) of generated parallel test data is available to tester (260) for performing the test verification.

Further, as shown in FIG. 2, tester (260) includes a conductor (263) to couple, when DUT (220) is mounted onto the load board of the tester (260), TX (212) to RX (242) thus placing SERDES (210) and SERDES (230) in a first loop-back configuration. In addition, tester (260) includes clock generator (261) configured to clock SERDES (210) after DUT (220) (in particular, SERDES (210) and SERDES (230)) enters the self-test mode such that Parallel-to-Serial converter (211) converts parallel test data generated by test pattern generator (215) into serial test data presented to TX (212) and coupled to RX (242) via conductor (263). In addition, tester (260) includes clock generator (262) configured to clock SERDES (230) after DUT (220) (in particular, SERDES (210) and SERDES (230)) enters the self-test mode such that serial test data coupled to RX (242) are converted into parallel verification data at parallel test output (244) for verification by test pattern verifier (235).

In one or more embodiments of the invention, test pattern verifier (235) may be configured to generate test results such as a measure of bit error rate (BER) of SERDES (210) by comparing the serial verification data to a reference test pattern (e.g., a delayed version of the parallel test data independently regenerated by test verifier (235) or communicatively obtained from test pattern generator (215)). In one or more embodiments of the invention, test pattern generator (215) and/or test pattern verifier (235) may be configured by or in communication with test (260) such that the test results may be generated in an appropriate manner. Techniques known to those skilled in the art may be employed for generating and verifying such test patterns to generate test results. In one or more embodiments of the invention, the test results may be provided to tester (260) via control circuit (240).

Further, as shown in FIG. 2, tester (260) includes controller (266) and Phase-Locked-Loop (PLL) clock generator (267). Controller (266) may be configured to cause DUT (220) to enter or exit the self-test mode, for example by sending self-test mode enable commands to control circuit (240). Controller (266) may also be configured to receive test results from DUT (220). PLL clock generator (267) may be configured to supply a high frequency clock to DUT (220). In one or more embodiments of the invention, DUT (220) may be configured to use the high frequency clock as a master clock for core (250) and use the clock signals received from clock generators (261) and (262) as I/O clocks in serial or parallel clock rate.

In one or more embodiments of the invention, clock generators (261), (262), and (267) may be programmable (e.g., programmed by controller (266)) to introduce (i.e., inject) various jitter scenarios into the high frequency clock and/or the I/O clocks to characterize the performance (e.g., BER) of DUT (220) corresponding to the introduced jitter scenario. For example, clock generators (262) and (267) may be programmed to supply clock signals to DUT (220), in particular SERDES (230), free of jitter while clock generator (261) may be programmed to supply clock signal to SERDES (210) with a jitter. Accordingly, a test result (e.g., BER) indicating performance of SERDES (210) corresponding to the injected jitter may be generated by test pattern verifier (235) as described above. In one or more embodiments of the invention, controller (266) may also be configured to adjust the jitter and receive an adjustment of the test results from DUT (220) responsive to adjusting the jitter. Accordingly, I/O module characterization (e.g., jitter sensitivity of BER for SERDES (210)) may be performed by tester (260). In one or more embodiments of the invention, I/O characterization report may be displayed, for example, as shmoo plots known to those skilled in the art.

Further as shown in FIG. 2, tester (260) includes a conductor (264) to couple, when DUT (220) is mounted onto the load board of the tester (260), TX (232) to RX (222) thus placing SERDES (210) and SERDES (230) in a second loop-back configuration. In addition, parallel test input (234) of Parallel-to-Serial converter (231) may be coupled to a test pattern generator (not shown) while parallel test output (224) of Serial-to-Parallel converter (221) may be coupled to a test pattern verifier (not shown). As described above, clock generators (261), (262), and (267) may be programmable to introduce various jitter scenarios. For example, clock generators (261) and (267) may be programmed to supply clock signals to DUT (220), in particular SERDES (210), free of jitter while clock generator (262) may be programmed to supply clock signal to SERDES (230) with a jitter. Accordingly, a test result (e.g., BER) indicating performance of SERDES (230) corresponding to the injected jitter may be generated by the test pattern verifier in a similar manner as described with respect to generating the test result for SERDES (210) above.

In one or more embodiments of the invention, each I/O module (e.g., SERDES (210) or SERDES (230)) of DUT (220) may independently include a local test pattern generator (e.g., (215)), a local test pattern verifier (e.g., (215)), and a external test clock input such that I/O characterization may be performed for any pair of I/O modules in the first or second look-back configuration by placing DUT (220) in self-test mode and programming corresponding clock generators in tester (260) appropriately. In one or more embodiments of the invention, I/O modules may share test clock input or test pattern generator for circuit resource efficiency. In one or more embodiments of the invention, I/O characterizations of different pairs of I/O modules may be performed concurrently when independent test clock inputs and test pattern verifiers are available. More details are described with respect to an example depicted in FIG. 4 below.

In one or more embodiments of the invention, clock generators (261) and (262) may be in communication with each other via coupling (265) such that clock signal generated from clock generator (261) is essentially the same, with the exception of the injected jitter, as clock signal generated from clock generator (262). For example, clock generators (261) and (262) may be synchronized with each other and each configured with independently programmable jitter injection functionality.

Techniques known to those skilled in the art may be employed for generating/programming various clock formats and for injecting jitters into clock signals in the description with respect to FIG. 2 above. Although not explicitly shown in FIG. 2, functionalities of various components of tester (260) may be coordinated to perform the various testing and characterization tasks described above. For example, parameters and test patterns of various clock generators, test pattern generator, and test pattern verifiers may be stored, processed, and programmed by a processor (with associated memory and other data repository) of a computer system (not shown) embedded in tester (260). Furthermore, tester pin electronics, socket or surface mount adapter components, series or parallel termination components, unidirectional or bidirectional buffer components, etc. that may be associated with one or more of the couplings represented by dashed lines between DUT (220) and tester (260) are omitted in FIG. 2 for clarity.

Figure 3:
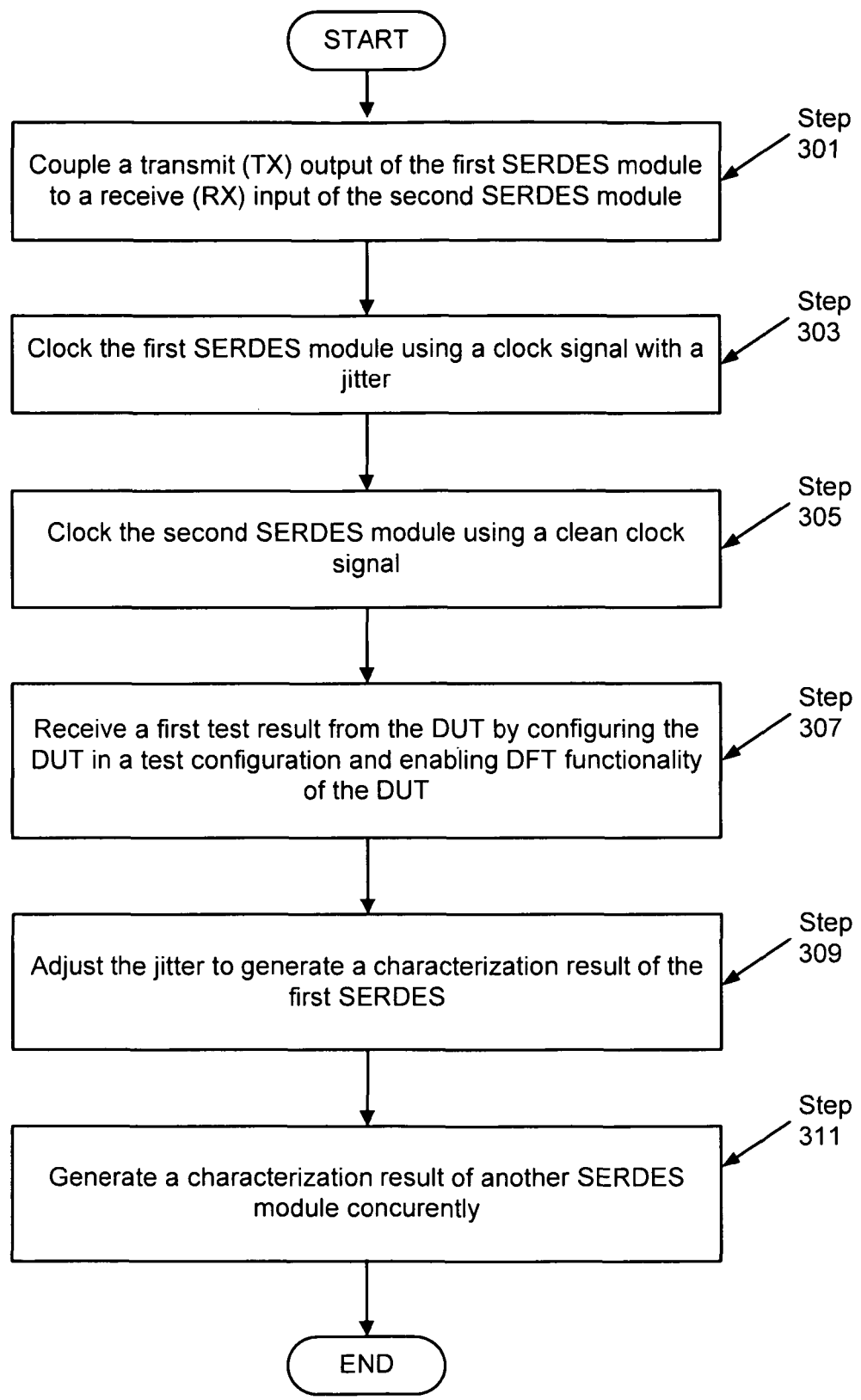
FIG. 3 shows a flowchart of a method in accordance with one or more embodiments of the invention.

FIG. 3 shows a flowchart of a method in accordance with one or more embodiments of the invention. In one or more embodiments of the invention, one or more of the steps shown in FIG. 3 may be omitted, repeated, and/or performed in a different order. Accordingly, those skilled in the art will appreciate many variations to the specific arrangements of steps shown in FIG. 1, which are also embodiments of the invention.

In one or more embodiments of the invention, the method depicted in FIG. 3 may be practiced using system (200) described with respect to FIG. 2 above for characterizing a device under test (DUT) that includes a pair of (i.e., first and second) serializer/deserializer (SERDES) modules. For example, the method utilizes a tester to form a loop-back configuration of the pair of SERDESes and supply a clean clock signal and a jitter-injected clock signal to the pair of SERDES to perform self-test based on DFT functionality built-in the DUT. Throughout this document, the term "SERDES" and "SERDES module" may be used interchangeably.

Initially, a transmit (TX) output of the first SERDES module is coupled to a receive (RX) input of the second SERDES module, for example via a first conduction on a load board of the tester (Step 301). The functionality and circuit topology of the first and second SERDESes may be essentially the same as described with respect to FIG. 2 above.

In Step 303, the first SERDES module is clocked using a first clock signal injected with a first jitter. For example, the first clock signal may be provided by a tester.

In Step 305, the second SERDES module may be clocked using a second clock signal that is equivalent to the first clock signal without the injected first jitter. For example, the first and second clock signal may be generated based on the same protocol, generated from the same source, or synchronized before the jitter is injected.

In Step 307, a first test result may be generated from the DUT by configuring the DUT in a self-test loop-back configuration and enabling a self-test functionality of the DUT. For example in the self-test loop-back configuration, a first parallel test data generated by a first test pattern generator built-in the DUT may be converted, using the first SERDES module based on the first clock signal, into first serial test data at the TX output of the first SERDES module, which in turn may be communicated to the RX input of the second SERDES module via the first conductor. In addition, the first serial test data at the RX input of the second SERDES module may be converted, using the second SERDES module based on the second clock, into first parallel verification data, which may be analyzed based on a first pre-determined criterion to generate a first test result using a first test pattern verifier comprised in the DUT.

In one or more embodiments of the invention, analyzing the first parallel verification data based on a first pre-determined criterion is by comparing the first parallel verification data to a delayed version of the first parallel test data. In one or more embodiments of the invention, the first test result may include a first bit error rate.

In Step 309, the first jitter may be adjusted. Accordingly, an adjustment of the first test result may be generated and received responsive to adjusting the first jitter. Furthermore, a characterization result of the first SERDES module may be generated based at least on the first test result and the adjustment of the first test result. For example, BER may vary based on the amount or type of jitter injected such that variations of BER may be presented in a Shmoo plot known to those skilled in the art.

In Step 311, characterization results may be generated for another SERDES module concurrently. For example, the DUT may also include third and fourth SERDES modules configured in essentially the same manner as the configuration of the first and second SERDES modules described above. Said in other words, the third and fourth SERDES modules may be configured in a self-test loop-back configuration established using a second conductor on the load board of the tester where the third and fourth SERDES modules may be clocked by a third and fourth clock generators in the tester programmed to inject a second jitter in essentially the same manner as described above with respect to the first and second SERDES modules.

Accordingly, a second test result indicating the performance of the third SERDES module operating with the injected second jitter may be generated by comparing a second parallel verification data based on a second pre-determined criterion (e.g., by comparing to a delayed version of a second parallel test data generated by a second test pattern generator included in the DUT) using a second data pattern verifier included in the DUT. Furthermore, the second jitter may be adjusted to generate adjustment of the second test result and generate a characterization result of the third SERDES module. In one or more embodiments of the invention, the first and second characterization results may be generated concurrently when independent test clock inputs and test pattern verifiers are available as required.

Techniques known to those skilled in the art may be employed to generate equivalent clock signals with or without the jitter and as well as to adjust the jitter as described with respect to FIG. 3 above.

Figure 4:
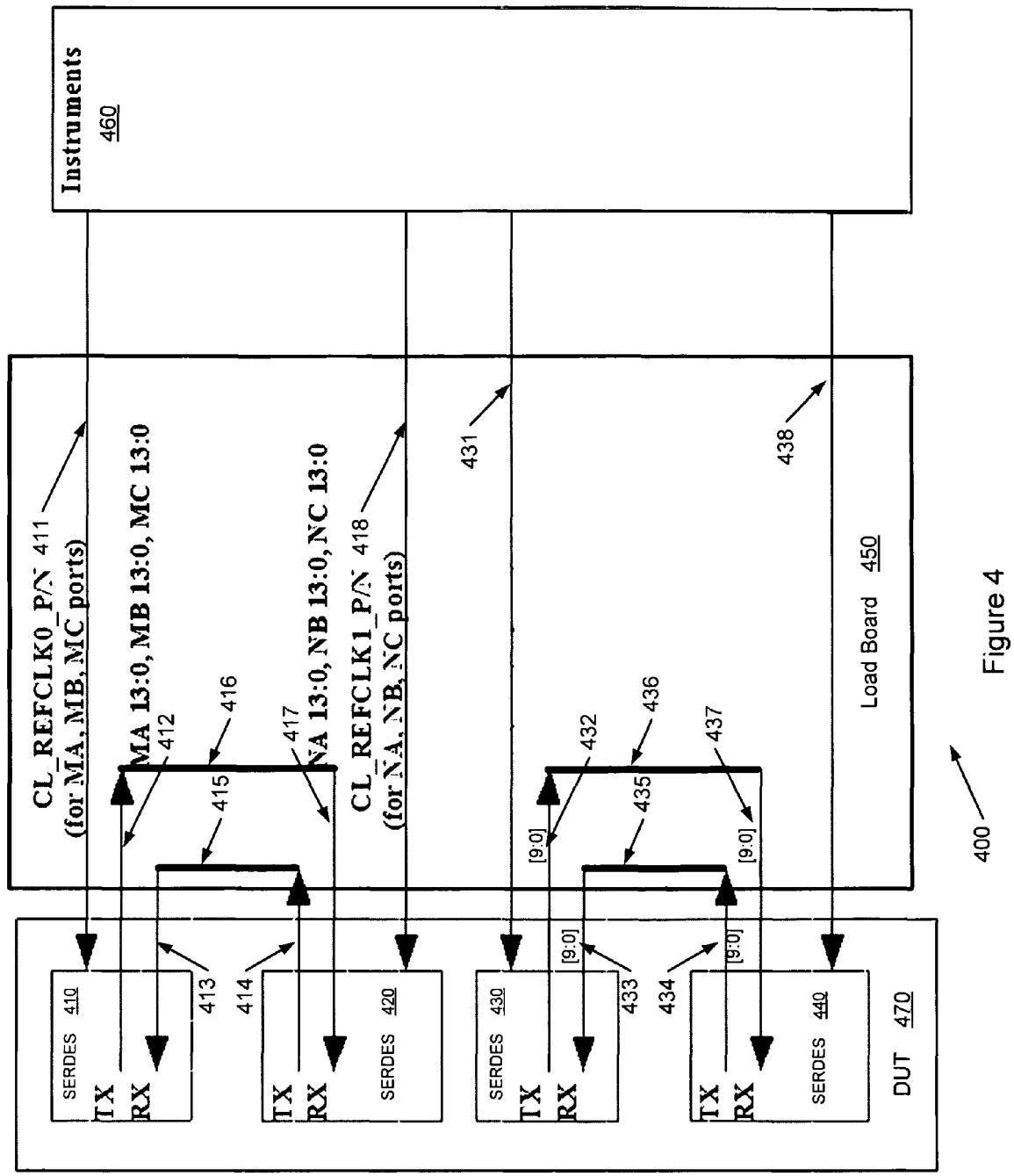
FIG. 4 shows an example application in accordance with one or more embodiments of the invention.

FIG. 4 shows an example application in accordance with one or more embodiments of the invention. As shown in FIG. 4, system (400) includes DUT (470) and a tester having a load board (450) and test instruments (460). The DUT (470) is shown to include two pairs of SERDES blocks, namely SERDES block pair (410)/(420) and SERDES block pair (430)/(440).

Furthermore, SERDES block (410) includes 42 SERDES modules organized in three ports MA 13:0, MB 13:0, and MC 13:0 each of which include 14 SERDES modules to support 14 lanes for data communication. These three ports MA 13:0, MB 13:0, and MC 13:0 includes 42 transmission lines depicted as TX (412) and 42 receive lines depicted as RX (413). SERDES block (420) includes 42 SERDES modules organized in three ports NA 13:0, NB 13:0, and NC 13:0 each of which include 14 SERDES modules to support 14 lanes for data communication. These three ports NA 13:0, NB 13:0, and NC 13:0 includes 42 transmission lines depicted as TX (414) and 42 receive lines depicted as RX (417).

Further as shown in FIG. 4, SERDES block pair (410)/(420) is configured in a self-test loop-back configuration via conductors (416) coupling TX (412) to RX (417) where 42 SERDES modules in SERDES block (410) share a common clock signal (411) labeled CL_REFCLK0_P/N and 42 SERDES modules in SERDES block (420) share a common clock signal (418) labeled CL_REFCLK1_P/N. Based on the method described with respect to FIG. 3 above, clock signals (411) and (418) may be equivalent with the exception that clock signal (411) is injected with a jitter. For example, clock signals (411) and (418) may be provided by test instrument (460) where the jitter is injected into the clock signal (411). Continue to follow Steps 307-311, 42 test results indicating performance (e.g., BER) of each SERDES module of the SERDES block (410) may be generated concurrently with respect to the injected jitter and characterization results may also be generated concurrently. In particular, test pattern generator(s) and test pattern verifiers for the 42 SERDES modules may be programmed with matching test patterns, for example PRBS7 pattern known to those skilled in the art.

In essentially the same manner as described above, SERDES block pair (410)/(420) may also be configured in another self-test loop-back configuration via conductors (415). In this configuration, clock signal (411) is provided from the instrument (460) without jitter while clock signal (418) is provided from the instrument (460) with the jitter such that 42 test results indicating performance (e.g., BER) of each SERDES module of the SERDES block (420) may be generated concurrently with respect to the injected jitter and characterization results may also be generated concurrently.

Furthermore, in essentially the same manner as described above, SERDES block pair (430)/(440) may also be configured in self-test loop-back configurations via conductors (435) or (436) coupling 10 lanes (i.e., [9:0]) TX (432)/RX (433) to 10 lanes (i.e., [9:0]) RX (437)/TX (434). In either configuration, shared clock signal (431) and (438) may be provided from the instrument (460) with one of them being injected with a jitter such that 10 test results indicating performance (e.g., BER) of each SERDES module of the SERDES block (430) or (440) may be generated concurrently with respect to the injected jitter and characterization results may also be generated concurrently. Furthermore, the characterization of SERDES block pair (410)/(420) and characterization of SERDES block pair (430)/(440) may be performed concurrently.

Figure 5:
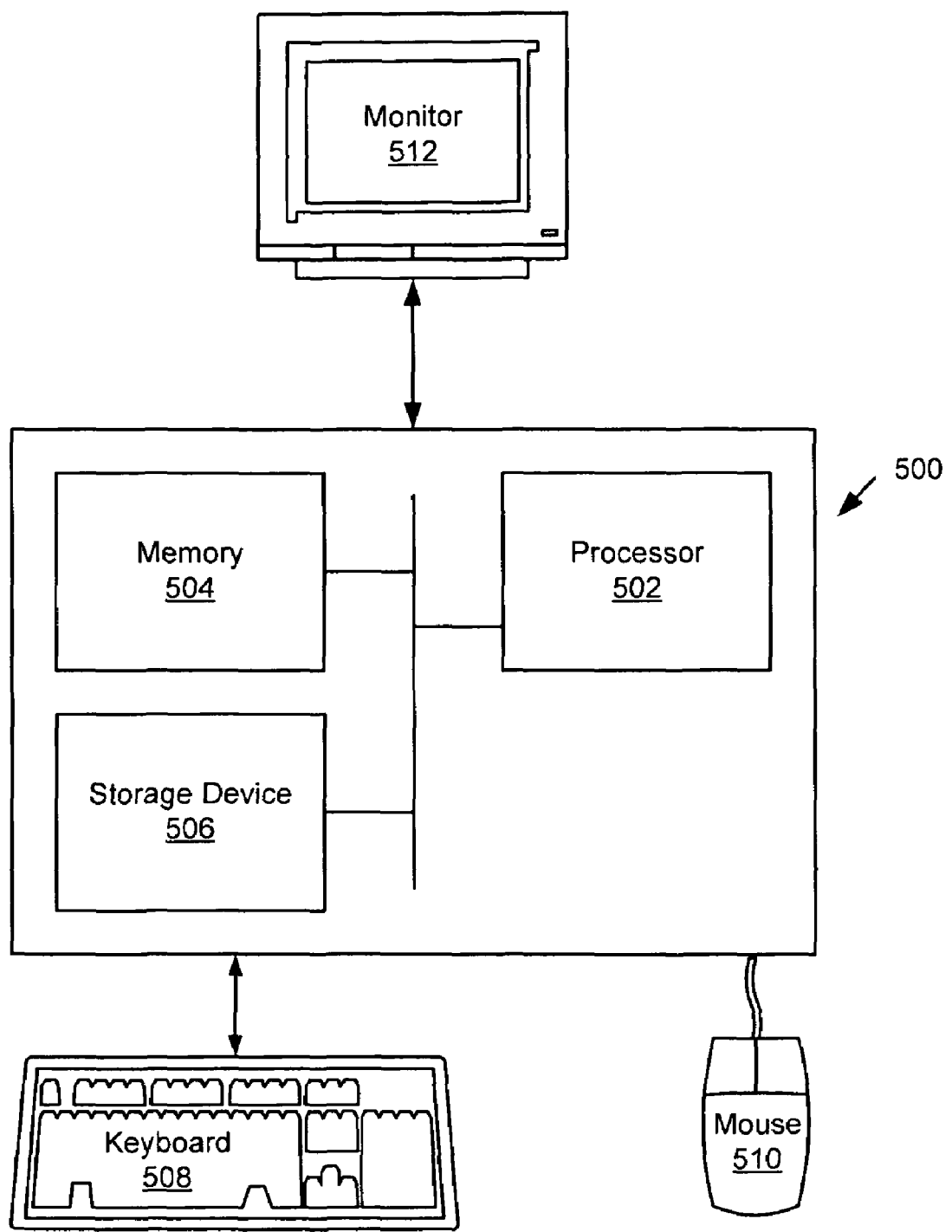
FIG. 5 shows a schematic block diagram of a computer system using which one or more embodiments of the invention may be implemented.

FIG. 5 shows a schematic block diagram of a computer system using which one or more embodiments of the invention may be implemented. As described with respect to FIGS. 1-3 above, a computer system may be included in the tester for coordinating components of the tester in performing I/O characterization of a device under test (DUT). For example, as shown in FIG. 5, a computer system (500) includes a processor (502), associated memory (504), a storage device (506), and numerous other elements and functionalities typical of today's computers. The computer (500) may also include input means, such as a keyboard (508) and a mouse (510), and output means, such as a monitor (512). The computer system (500) may be connected to a local area network (LAN) or a wide area network (e.g., the Internet) via a network interface connection (not shown). Those skilled in the art will appreciate that other forms of computer readable medium may be used to substitute or complement the associated memory (504) and the storage device (506); in addition input and output means may take other forms.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A tester for characterizing a device under test (DUT) comprising first and second serializer/deserializer (SERDES) modules, comprising:
    a first conductor adapted to, when the DUT is operatively coupled to the tester, couple a transmit (TX) output of the first SERDES module to a receive (RX) input of the second SERDES module;
    a first clock generator configured to, when the DUT is operatively coupled to the tester, clock the first SERDES module using a first clock signal;
    a second clock generator configured to, when the DUT is operatively coupled to the tester, clock the second SERDES module using a second clock signal, wherein the first clock signal is equivalent to the second clock signal with a first jitter; and
    a functional module configured to, when the DUT is operatively coupled to the tester, receive a first test result from the DUT by configuring the DUT to:
        convert, using the first SERDES module based on the first clock, first parallel test data generated by a first test pattern generator comprised in the DUT into first serial test data at the TX output of the first SERDES module, wherein the first serial test data is communicated to the RX input of the second SERDES module via the first conductor;
        convert, using the second SERDES module based on the second clock, the first serial test data at the RX input of the second SERDES module into first parallel verification data; and
        generate the first test result by analyzing the first parallel verification data based on a first pre-determined criterion using a first test pattern verifier comprised in the DUT.

2. The tester of claim 1,
    wherein analyzing the first parallel verification data based on a first pre-determined criterion is by comparing the first parallel verification data to a delayed version of the first parallel test data,
    wherein the first test result comprises a first bit error rate, and
    wherein the functional module is further configured to:
        adjust the first jitter;
        receive an adjustment of the first test result from the DUT responsive to adjusting the first jitter; and
        generate a characterization result of the first SERDES module based at least on the first test result and the adjustment of the first test result.

3. The tester of claim 1, the DUT further comprising third and fourth SERDES modules, the tester further comprising:
    a second conductor adapted to, when the DUT is operatively coupled to the tester, couple a transmit (TX) output of the third SERDES module to a receive (RX) input of the fourth SERDES module;
    wherein the functional module is further configured to, when the DUT is operatively coupled to the tester, receive a second test result concurrently with receiving the first test result, from the DUT, wherein the DUT is further configured by the functional module to:
  convert, using the third SERDES module, second parallel test data generated by a second test pattern generator comprised in the DUT into second serial test data at the TX output of the third SERDES module, wherein the second serial test data is communicated to the RX input of the fourth SERDES module via the second conductor;
  convert, using the fourth SERDES module, the second serial test data at the RX input of the fourth SERDES module into second parallel verification data; and
  generate the second test result, concurrently with generating the first test result, by analyzing the second parallel verification data based on a second pre-determined criterion using a second test pattern verifier comprised in the DUT.

4. The tester of claim 3,
wherein the first clock generator is further configured to, when the DUT is operatively coupled to the tester, clock the third SERDES module using the first clock signal,
wherein the second clock generator is further configured to, when the DUT is operatively coupled to the tester, clock the fourth SERDES module using the second clock signal,
wherein the DUT converting the second parallel test data into the second serial test data is based on the first clock, and
wherein the DUT converting the second serial test data into the second parallel verification data is based on the second clock.

5. The tester of claim 4, wherein the functional module is further configured to:
  adjust the first jitter;
  receive an adjustment of the first and second test results responsive to adjusting the first jitter; and
  generate a characterization result of the first and second SERDES modules concurrently based at least on the first and second test results and the adjustment of the first and second test results.

6. The tester of claim 3, the DUT further comprising third and fourth SERDES modules, the tester further comprising:
  a third clock generator configured to, when the DUT is operatively coupled to the tester, clock the third SERDES module using a third clock signal; and
  a fourth clock generator configured to, when the DUT is operatively coupled to the tester, clock the fourth SERDES module using a fourth clock signal, wherein the third clock signal is equivalent to the fourth clock signal with a second jitter,
  wherein the DUT converting the second parallel test data into the second serial test data is based on the third clock, and
  wherein the DUT converting the second serial test data into the second parallel verification data is based on the fourth clock.

7. The tester of claim 6, wherein the functional module is further configured to:
  adjust the first jitter;
  receive an adjustment of the first test result responsive to adjusting the first jitter;
  generate a characterization result of the first SERDES module based at least on the first test result and the adjustment of the first test result;
  adjust the second jitter;
  receive an adjustment of the second test result responsive to adjusting the second jitter; and
  generate a characterization result of the third SERDES module based at least on the second test result and the adjustment of the first test result,
  wherein the characterization results of the first and third SERDES modules are generated concurrently.

8. A method for characterizing a device under test (DUT) comprising first and second serializer/deserializer (SERDES) modules, comprising:
  coupling a transmit (TX) output of the first SERDES module to a receive (RX) input of the second SERDES module;
  clocking the first SERDES module using a first clock signal;
  clocking the second SERDES module using a second clock signal, wherein the first clock signal is equivalent to the second clock signal with a first jitter; and
  receiving a first test result from the DUT by configuring the DUT to:
    convert, using the first SERDES module based on the first clock, first parallel test data generated by a first test pattern generator comprised in the DUT into first serial test data at the TX output of the first SERDES module, wherein the first serial test data is communicated to the RX input of the second SERDES module via the first conductor;
    convert, using the second SERDES module based on the second clock, the first serial test data at the RX input of the second SERDES module into first parallel verification data; and
    generate the first test result by analyzing the first parallel verification data based on a first pre-determined criterion using a first test pattern verifier comprised in the DUT.

9. The method of claim 8,
wherein analyzing the first parallel verification data based on a first pre-determined criterion is by comparing the first parallel verification data to a delayed version of the first parallel test data,
wherein the first test result comprises a first bit error rate, and
wherein the method further comprising:
  adjusting the first jitter;
  receiving an adjustment of the first test result responsive to adjusting the first jitter; and
  generating a characterization result of the first SERDES module based at least on the first test result and the adjustment of the first test result.

10. The method of claim 8, the DUT further comprising third and fourth SERDES modules, the method further comprising:
  coupling a transmit (TX) output of the third SERDES module to a receive (RX) input of the fourth SERDES module;
  receiving a second test result, concurrently with receiving the first test result, from the DUT by further configuring the DUT to:
    convert, using the third SERDES module, second parallel test data generated by a second test pattern generator comprised in the DUT into second serial test data at the TX output of the third SERDES module, wherein the second serial test data is communicated to the RX input of the fourth SERDES module via the second conductor;
    convert, using the fourth SERDES module, the second serial test data at the RX input of the fourth SERDES module into second parallel verification data; and generate the second test result, concurrently with generating the first test result, by analyzing the second parallel verification data based on a second pre-determined criterion using a second test pattern verifier comprised in the DUT.

11. The method of claim 9,
wherein the first clock generator is further configured to, when the DUT is operatively coupled to the tester, clock the third SERDES module using the first clock signal,
wherein the second clock generator is further configured to, when the DUT is operatively coupled to the tester, clock the fourth SERDES module using the second clock signal,
wherein the DUT converting the second parallel test data into the second serial test data is based on the first clock, and
wherein the DUT converting the second serial test data into the second parallel verification data is based on the second clock.

12. The method of claim 11 further comprising:
adjusting the first jitter;
receiving an adjustment of the first and second test results responsive to adjusting the first jitter; and
generating a characterization result of the first and second SERDES modules concurrently based at least on the first and second test results and the adjustment of the first and second test results.

13. The method of claim 9, the DUT further comprising third and fourth SERDES modules, the method further comprising:
clocking the third SERDES module using a third clock signal; and
clocking the fourth SERDES module using a fourth clock signal, wherein the third clock signal is equivalent to the fourth clock signal with a second jitter,
wherein the DUT converting the second parallel test data into the second serial test data is based on the third clock, and
wherein the DUT converting the second serial test data into the second parallel verification data is based on the fourth clock.

14. The method of claim 13 further comprising:
adjusting the first jitter;
receiving an adjustment of the first test result responsive to adjusting the first jitter;
generating a characterization result of the first SERDES module based at least on the first test result and the adjustment of the first test result;
adjusting the second jitter;
receiving an adjustment of the second test result responsive to adjusting the second jitter; and
generating a characterization result of the third SERDES module based at least on the second test result and the adjustment of the first test result,
wherein the characterization results of the first and third SERDES modules are generated concurrently.

15. A computer readable medium having instructions for characterizing a device under test (DUT) comprising first and second serializer/deserializer (SERDES) modules, the instructions when executed by a processor comprising functionality for:
coupling a transmit (TX) output of the first SERDES module to a receive (RX) input of the second SERDES module;
clocking the first SERDES module using a first clock signal;
clocking the second SERDES module using a second clock signal, wherein the first clock signal is equivalent to the second clock signal with a first jitter; and
receiving a first test result from the DUT by configuring the DUT to:
convert, using the first SERDES module based on the first clock, first parallel test data generated by a first test pattern generator comprised in the DUT into first serial test data at the TX output of the first SERDES module, wherein the first serial test data is communicated to the RX input of the second SERDES module via the first conductor;
convert, using the second SERDES module based on the second clock, the first serial test data at the RX input of the second SERDES module into first parallel verification data; and
generate the first test result by analyzing the first parallel verification data based on a first pre-determined criterion using a first test pattern verifier comprised in the DUT.

16. The computer readable medium of claim 15,
wherein analyzing the first parallel verification data based on a first pre-determined criterion is by comparing the first parallel verification data to a delayed version of the first parallel test data,
wherein the first test result comprises a first bit error rate, and
wherein the method further comprising:
adjusting the first jitter;
receiving an adjustment of the first test result responsive to adjusting the first jitter; and
generating a characterization result of the first SERDES module based at least on the first test result and the adjustment of the first test result.

17. The computer readable medium of claim 15, the DUT further comprising third and fourth SERDES modules, the instructions when executed by the processor further comprising functionality for:
coupling a transmit (TX) output of the third SERDES module to a receive (RX) input of the fourth SERDES module;
receiving a second test result, concurrently with receiving the first test result, from the DUT by further configuring the DUT to:
convert, using the third SERDES module, second parallel test data generated by a second test pattern generator comprised in the DUT into second serial test data at the TX output of the third SERDES module, wherein the second serial test data is communicated to the RX input of the fourth SERDES module via the second conductor;
convert, using the fourth SERDES module, the second serial test data at the RX input of the fourth SERDES module into second parallel verification data; and
generate the second test result, concurrently with generating the first test result, by analyzing the second parallel verification data based on a second pre-determined criterion using a second test pattern verifier comprised in the DUT.

18. The computer readable medium of claim 17,
wherein the first clock generator is further configured to, when the DUT is operatively couple to the tester, clock the third SERDES module using the first clock signal,
wherein the second clock generator is further configured to, when the DUT is operatively couple to the tester, clock the fourth SERDES module using the second clock signal, wherein the DUT converting the second parallel test data into the second serial test data is based on the first clock, and wherein the DUT converting the second serial test data into the second parallel verification data is based on the second clock.

19. The computer readable medium of claim 18, the instructions when executed by the processor further comprising functionality for:

adjusting the first jitter;

receiving an adjustment of the first and second test results responsive to adjusting the first jitter; and generating a characterization result of the first and second SERDES modules concurrently based at least on the first and second test results and the adjustment of the first and second test results.

20. The computer readable medium of claim 17, the DUT further comprising third and fourth SERDES modules, the instructions when executed by the processor further comprising functionality for:

clocking the third SERDES module using a third clock signal, wherein the DUT converting the second parallel test data into the second serial test data is based on the third clock;

clocking the fourth SERDES module using a fourth clock signal, wherein the third clock signal is equivalent to the fourth clock signal with a second jitter, wherein the DUT converting the second serial test data into the second parallel verification data is based on the fourth clock;

adjusting the first jitter;

receiving an adjustment of the first test result responsive to adjusting the first jitter;

generating a characterization result of the first SERDES module based at least on the first test result and the adjustment of the first test result;

adjusting the second jitter;

receiving an adjustment of the second test result responsive to adjusting the second jitter; and generating a characterization result of the third SERDES module based at least on the second test result and the adjustment of the first test result, wherein the characterization results of the first and third SERDES modules are generated concurrently.

* * * * *